US008729597B2

(12) United States Patent
Kim et al.

(10) Patent No.: US 8,729,597 B2
(45) Date of Patent: May 20, 2014

(54) CONTROL METHOD FOR DEVICE USING DOPED CARBON-NANOSTRUCTURE AND DEVICE COMPRISING DOPED CARBON-NANOSTRUCTURE

(75) Inventors: Sang Ouk Kim, Daejeon (KR); Ji Sun Park, Daejeon (KR); Ju Min Lee, Daejeon (KR); Myoung Hoon Song, Ulsan (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 211 days.

(21) Appl. No.: 13/298,162

(22) Filed: Nov. 16, 2011

(65) Prior Publication Data

US 2012/0267602 A1 Oct. 25, 2012

(30) Foreign Application Priority Data

Apr. 22, 2011 (KR) ........................ 10-2011-0037571

(51) Int. Cl.
*H01L 33/14* (2010.01)
*H01L 33/26* (2010.01)
*H01L 31/0256* (2006.01)

(52) U.S. Cl.
USPC .... 257/102; 257/103; 257/439; 257/E33.036; 257/E31.025

(58) Field of Classification Search
USPC .......... 257/102, 103, 439, E33.036, E31.025
See application file for complete search history.

(56) References Cited

U.S. PATENT DOCUMENTS

| 7,253,431 | B2* | 8/2007 | Afzali-Ardakani et al. .... 257/20 |
| 7,858,876 | B2* | 12/2010 | Lagally et al. ................ 136/255 |
| 7,952,088 | B2* | 5/2011 | Anderson et al. ............... 257/24 |
| 8,168,964 | B2* | 5/2012 | Hiura et al. ....................... 257/9 |
| 8,288,190 | B2* | 10/2012 | Kim ................................. 438/50 |
| 8,354,323 | B2* | 1/2013 | Bowers et al. ................ 438/311 |
| 2006/0105200 | A1* | 5/2006 | Poplavskyy et al. .......... 428/690 |
| 2012/0025181 | A1* | 2/2012 | Sasaki ............................ 257/40 |

FOREIGN PATENT DOCUMENTS

KR 10-0868940 B1 11/2008

OTHER PUBLICATIONS

Fiori et al., "Threshold voltage dispersion and impurity scattering limited mobility in carbon nanotube field effect transistors with randomly doped reservoirs", IEEE, Apr. 2006, pp. 202-205.*

* cited by examiner

*Primary Examiner* — Evan Pert
(74) *Attorney, Agent, or Firm* — Stevens & Showalter LLP (57) ABSTRACT

Provided is a method for controlling a device using a doped carbon-nanostructure, and a device including the doped carbon-nanostructure, in which the method for controlling the device selectively controls the mobility of electrons or holes using N-type or P-type doped carbon-nanostructure; the N-type or P-type impurities-doped carbon-nanostructure can selectively control the transport of electrons or holes according to a doped material; and also since the doped carbon-nanostructure limits the transport of charge that is the opposite charge to the transport facilitating charge, it can improve the efficiency of device by adding to a functional layer of device or using as a separate layer in the electrons or holes-only transporting device.

13 Claims, 14 Drawing Sheets

| Device Configuration | Bias @ 100 mA/cm² | L$_{max}$(cd/m²) @bias | LE$_{max}$(cd/A) @bias | LE$_{max}$(lm/W) @bias | EQE$_{max}$(%) @bias |
|---|---|---|---|---|---|
| ZnO/Cs$_2$CO$_3$ | 13.0V | 21,000 (@14.6V) | 6.9 (@13.4V) | 1.6 (@13.0V) | 2.2 (@13.4V) |
| ZnO+MWNT (0.08%) / Cs$_2$CO$_3$ | 12.4V | 25,000 (@14.4V) | 8.9 (@12.8V) | 2.2 (@12.4V) | 2.8 (@12.8V) |
| ZnO+B-MWNT (0.08%) / Cs$_2$CO$_3$ | 13.4V | 15,000 (@16.0V) | 4.2 (@14.0V) | 0.9 (@14.0V) | 1.3 (@14.0V) |
| ZnO+N-MWNT (0.08%) / Cs$_2$CO$_3$ | 11.2V | 46,100 (@14.0V) | 14.3 (@13.6V) | 3.5 (@13.2V) | 4.3 (@13.2V) |

| Device Configuration | Electron Mobility ($\mu_e$) ($cm^2V^{-1}s^{-1}$) |
|---|---|
| ZnO / Cs$_2$CO$_3$ / F8BT (400 nm) | $6.4 \times 10^{-6}$ |
| ZnO + MWNT / Cs$_2$CO$_3$ / F8BT (400 nm) | $1.2 \times 10^{-5}$ |
| ZnO + N-MWNT / Cs$_2$CO$_3$ / F8BT (400 nm) | $4.6 \times 10^{-5}$ |
| ZnO + B-MWNT / Cs$_2$CO$_3$ / F8BT (400 nm) | $1.9 \times 10^{-6}$ |

| Device Configuration | Max.L(cd/m²) @bias | LE$_{max}$(cd/A) @bias | LE$_{max}$(lm/W) @bias | EQE$_{max}$(%) @bias |
|---|---|---|---|---|
| ZnO / N-MWNT (0.005 mgmL⁻¹) / F8BT (450nm) / MoO₃ / Au | 45,270 (@15.6V) | 9.9 (@15.2V) | 2.0 (@15.2V) | 2.8 (@15.2V) |
| ZnO / N-MWNT (0.005 mgmL⁻¹) / F8BT (550 nm) / MoO₃ / Au | 75,290 (@15.2V) | 19.0 (@14.8V) | 4.0 (@14.8V) | 5.5 (@14.8V) |
| ZnO / N-MWNT (0.005 mgmL⁻¹) / F8BT (750 nm) / MoO₃ / Au | 73,300 (@17.6V) | 36.3 (@17.2V) | 6.6 (@17.2V) | 10.4 (@17.2V) |

*Fig. 14*

CONTROL METHOD FOR DEVICE USING DOPED CARBON-NANOSTRUCTURE AND DEVICE COMPRISING DOPED CARBON-NANOSTRUCTURE

CROSS REFERENCE TO RELATED APPLICATION

This application claims the benefit of Korean Patent Application No. 10-2011-0037571 filed on Apr. 22, 2011, which is hereby incorporated by reference in its entirety into this application.

BACKGROUND

1. Technical Field

The present disclosure disclosed herein relates to a method for controlling a device using a doped carbon-nanostructure and a device including a doped carbon-nanostructure, and more particularly, to a method for controlling a device using a doped carbon-nanostructure and a device including a doped carbon-nanostructure, in which the method is a new process that can effectively improve performances of various kinds of devices based on the transport of electrons or holes by selectively controlling the mobility of electrons or holes selectively using N-type or P-type doped carbon-nanostructure.

2. Description of the Related Art

Typically, many kinds of devices have been developed and used according to the demands of diversified information oriented society due to the advancements in information technology. One of the devices is a light emitting device that emits light by selectively transporting electrons or holes and then binding them, and includes Light-emitting diode (LED), Organic light-emitting diode (OLED), and the like. The other is an optoelectronic device that generates electrons by an irradiated light, and includes a solar cell and CMOS image sensor. Either the element that generates light or the device that separates carrier, such as electrons, from light requires the technique for selectively controlling the transport speed of electrons or holes. That is, the electron transport layer of the device should decrease the mobility of holes, not increases the mobility of electrons, but in the case of the opposite situation, it should increase the mobility of holes. Therefore, there is an urgent need for the developments of material and method for selectively controlling the motilities of electrons and holes by adding to the existed materials.

BRIEF SUMMARY

The present disclosure provides a method for controlling a device and a material for this, in which the method can improve the performance of the selective electrons and holes transporting device by selectively controlling the transport of electrons or holes.

Embodiments of the present disclosure provide methods for controlling a device including a selective electron or hole transporting layer, the methods including selectively controlling mobility of electrons or holes by using an N-type or P-type doped carbon-nanostructure.

In some embodiments, the carbon-nanostructure may include a graphite structure, and the carbon-nanostructure may be selected from the group consisting of graphene, carbon nanotube, carbon nanowire, graphite, fullerene, graphene quantum dot, and graphene nanoribbon.

In other embodiments, the P-type doped carbon-nanostructure may increase the mobility of holes and decrease the mobility of electrons in the hole transporting layer.

In still other embodiments, the N-type doped carbon-nanostructure may increase the mobility of electrons and decrease the mobility of holes in the electron transporting layer.

In even other embodiments, the carbon-nanostructure may be carbon nanotube, and the carbon nanotube may be multi-wall carbon nanotube.

In yet other embodiments, the device may be a light emitting device. Alternatively, the device may be a solar cell or a thin film transistor.

In other embodiments of the present disclosure, light emitting devices include a selective electron or hole transporting layer, wherein the selective electron or hole transporting layer includes triad- or pentad-doped carbon-nanostructure.

In some embodiments, the carbon-nanostructure may be carbon nanotube, the triad may be boron, and the pentad may be nitrogen.

In other embodiments, the carbon nanotube may be multi-wall carbon nanotube, and the selective hole transporting layer may include a triad-doped carbon nanotube to increase the mobility of holes in the selective hole transporting layer.

In even other embodiments, the selective electron transporting layer may include a pentad-doped carbon nanotube to increase the mobility of electrons in the selective electron transporting layer.

In still other embodiments of the present disclosure, light emitting devices include an electron transport layer and a hole transport layer, wherein at least one of the electron transport layer and the hole transport layer includes a nitrogen-doped carbon nanotube or a boron-doped carbon nanotube.

In some embodiments, the electron transport layer may include a nitrogen-doped carbon nanotube, and the hole transport layer may include a boron-doped carbon nanotube.

In even other embodiments of the present disclosure, light emitting devices include: an electron transport layer; a hole transport layer; an active layer disposed between the electron transport layer and the hole transport layer; and a nitrogen-doped carbon nanotube layer disposed between the electron transport layer and the active layer.

In some embodiments, the nitrogen-doped carbon nanotube may increase movement of electrons to the active layer and decrease movement of holes at the same time.

In yet other embodiments of the present disclosure, light emitting devices includes: an electron transport layer; a hole transport layer; an active layer disposed between the electron transport layer and the hole transport layer; and a boron-doped carbon nanotube layer disposed between the hole transport layer and the active layer.

In some embodiments, the born-doped carbon nanotube may increase movement of holes to the active layer and decrease mobility of electrons at the same time.

According to the present disclosure, N-type or P-type impurities-doped carbon-nanostructure can selectively control the transport of electrons or holes according to a doped material. Moreover, since the doped carbon-nanostructure according to the present disclosure limits the transport of charge that is the opposite charge to the transport facilitating charge, it can improve the efficiency of device by adding to a functional layer of electrons or holes-only transport device or using as a separate layer.

BRIEF DESCRIPTION OF THE SEVERAL VIEWS OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

The attached drawings for illustrating preferred embodiments of the present disclosure are referred to in order to gain a sufficient understanding of the present disclosure, the merits thereof, and the objectives accomplished by the implementation of the present disclosure.

Hereinafter, the present disclosure will be described in detail by explaining preferred embodiments of the disclosure with reference to the attached drawings. The present disclosure may, however, be embodied in many different forms and should not be construed as being limited to the embodiments set forth herein; rather, these embodiments are provided so that this disclosure will be thorough and complete, and will fully convey the scope of the inventive concept to those skilled in the art. In the drawings, parts not related to descriptions are omitted for clarity, and like reference numerals in the drawings denote like elements.

Furthermore, when it is described that one comprises (or includes or has) some elements, it should be understood that it may comprise (or include or has) only those elements, or it may comprise (or include or have) other elements as well as those elements if there is no specific limitation.

The present disclosure uses N-type or P-type doped carbon-nanostructure as a material for selectively controlling the charge transport of electrons or holes. In this situation, the control of the charge transport means the mobility/speed increases by facilitating the charge transport of specific type. In addition, on the other side of the coin, it means that the charge transport of the opposite type also includes the functions on preventing or reducing.

The carbon-nanostructure according to the present disclosure is a material including a graphite structure consisting of hexagonal carbon, and the carbon-nanostructure according to the present disclosure includes graphene, carbon nanotube, or carbon nanowire. In addition, all of any materials based on the graphite structure, such as, graphite, fullerene, graphene quantum dot, and graphene nanoribbon are the carbon-nanostructure according to the present disclosure, and belongs to the range of the present disclosure.

According to the present disclosure, N-type impurities- or P-type impurities-doped carbon-nanostructure changes a type of charge increasing the mobility according to the doped material thereof. For example, P-type impurities-doped material with a deficient peripheral electron as compared with fourth carbon that consist the carbon-nanostructure increases the mobility of holes. In the case of the opposite situation, that is, N-type impurities-doped carbon-nanostructure increases the mobility of electrons. Moreover, when the doped carbon-nanostructure is used as an independent device layer, the effect on blocking the opposite charge is generated, and hereinafter, it will be described in more detail.

The carbon-nanostructure according to some embodiments of the present disclosure is carbon nanotube, and especially, preferably at least two, multi-wall carbon nanotube. In the case of the single-wall carbon nanotube, the nanotube structure may be modified during impurities doping process.

In some embodiment of the present disclosure, the device is a light emitting device that generates light by transporting electrons and holes to each route and then by binding, and for example includes a light emitting diode or organic light emitting device, and the like. On the other side of the coin, a solar cell, and the like, that generates electrons by light, may use the doped carbon nanotube that increases the mobility of electrons according to the present disclosure, and also belongs to the range of the present disclosure.

In some embodiments of the present disclosure, the light emitting device including the selective electrons or holes-transporting layer uses the doped carbon-nanostructure as mentioned above, and in this situation, each selective electrons or holes transporting layer adds or includes triad or pentad-doped carbon-nanostructure. In this situation, the carbon-nanostructure is carbon nanotube, in which the triad is boron and the pentad is nitrogen.

Hereinafter, the present disclosure will be described in more detail with reference to the preferable Examples.

EXAMPLES

Example 1-1

Preparation of Doped Carbon Nanotube

The present Example used carbon nanotube as a one dimensional nanostructure. To achieve this, the carbon nanotube (Purity: >about 95%, Multi-Wall) growth by Chemical Vapor Deposition from Hanwhananotech Inc. was first purchased, about 1 g of the carbon nanotube was sonicated in about 500 ml of acid solution (Nitric acid: Sulfuric acid=1:3) for about 10 hours. And then it was washed with deionized water (DI), and filtered. The filtered carbon nanotube was dried, and then heated at about 400° C. for about 40 minutes to remove all the amorphous carbons. The average diameter of the carbon nanotube (non-doped) obtained from the above process was below about 1 µm. In addition, the non-doped purified carbon nanotube (non-doped carbon nanotube) prepared from the present Example had metallicity due to the property of multi-wall carbon nanotube.

The boron-doping process of the carbon nanotube was performed in a way of heating the carbon nanotube with a vaporized $B_2O_3$ while Ar (40 sccm) and $NH_3$ (60 sccm) gases were flowing. Since the carbon atom with a graphite structure was directly difficult to substitute, the present disclosure induced a vacancy defect of $CN_x$ and $C_xH_y$ groups in the carbon nanotube using $NH_3$ as an etching gas. The boron-doping process will be described in more detail as follows: Firstly, the carbon nanotube purified in Example was mixed with $B_2O_3$ in a type of powder, and piled up to the sintered open graphite crucible. The weight fraction of $B_2O_3$ and carbon nanotube was about 5. The mixture of $B_2O_3$:carbon nanotube was heated at about 1100° C. for about 4 hours while the mixed gas of Ar (40 sccm) and $NH_3$ (60 sccm) was flowing. After heating, the residue $B_2O_3$ powder was washed with hot deionized water. The nitrogen-doping process was performed in a way of heating the carbon nanotube purified in Example at about 1100° C. for about 4 hours in the crucible.

Example 1-2

Preparation of Doped Carbon Nanotube Dispersed ZnO Solution

Zinc acetate dihydrate ($Zn(CH_3COO)_2.2H_2O$, Sigma-Aldrich) was dissolved in 2-methoxyethanol (Concentration: 0.032 wt %). Ethanolamine (Concentration: 0.002 wt %) was additionally added to the solution as a stabilizer and then stirred at about 60° C. for about 1 hour. The non-doped purified carbon nanotube (hereinafter, Non-doped carbon nanotube), and the boron-doped carbon nanotube and nitrogen-doped carbon nanotube of Example 1-1 (Concentration: 0.02 wt %) were added to the prepared zinc acetate dihydrate/ 2-methoxyethanol solution, respectively, and then sonicated for about 4 hours. The prepared dispersing solution was performed through the precipitation process for about 24 hours, and then non-precipitated supernatant (Concentration: 0.016 wt %) was finally used.

Figure 1:
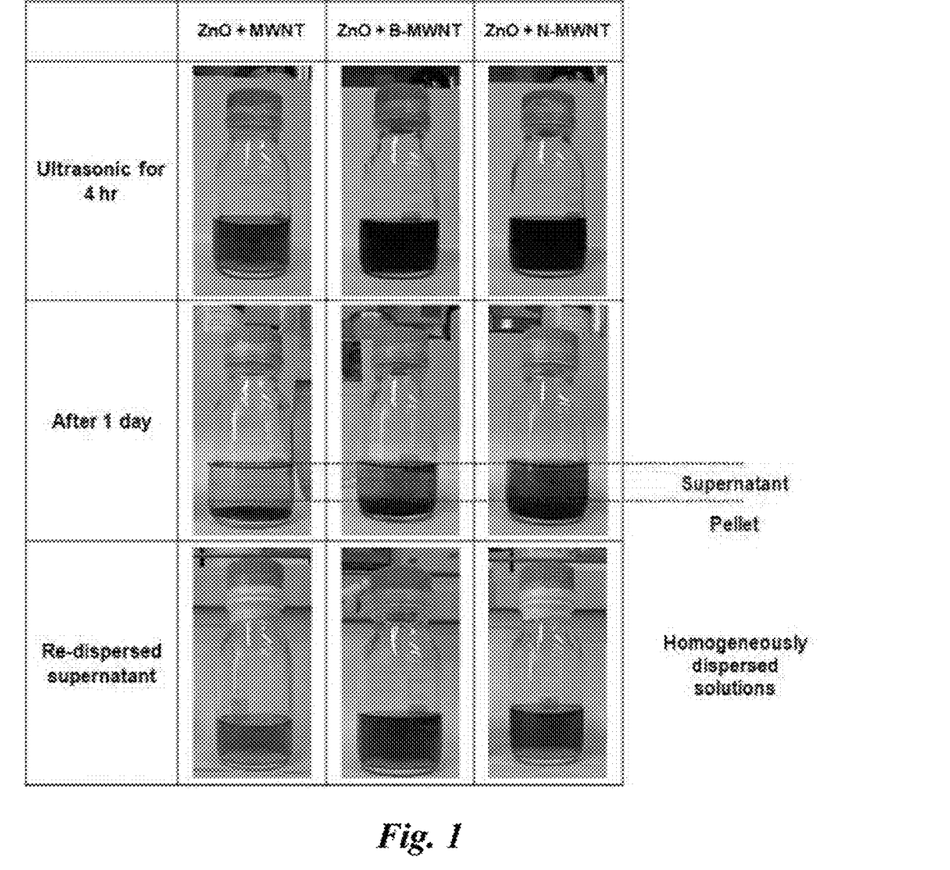
FIG. 1 is photographs showing ZnO solutions that are dispersed with carbon nanotube.

FIG. 1 is photographs showing ZnO solutions that are dispersed with carbon nanotube.

Example 1-3

Preparation of Light Emitting Diode Device

Figure 2:
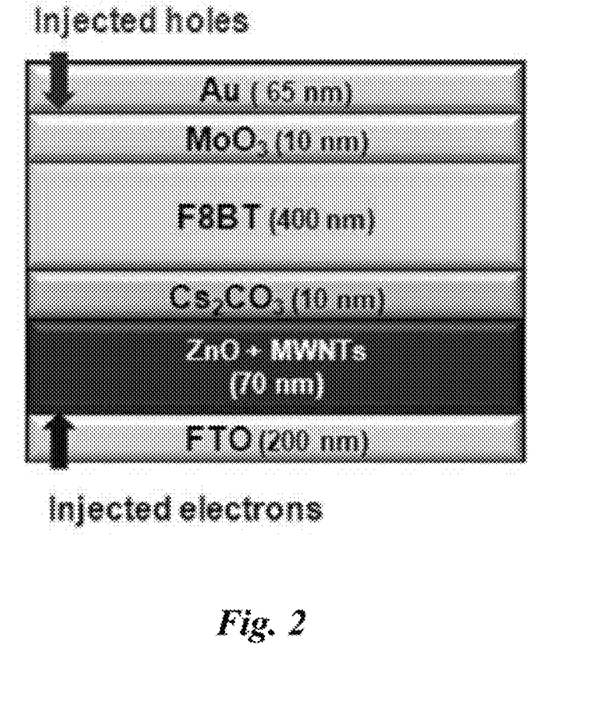
FIG. 2 is a diagram showing a light emitting diode structure prepared according to some embodiments of the present disclosure.

The doped carbon nanotube dispersed ZnO solution prepared from Example 1-2 including 0.08% of carbon nanotube based on zinc acetate dihydrate/methanol solution (Concentration: 8 wt %) was added and spray-applied on FTO layer that is transparent electron at about 400° C., and then heat-degradated to prepare ZnO+ doped carbon nanotube (or non-doped carbon nanotube) nano composite film that is Electron Transport Layer (ETL) with the thickness of about 70 nm. As Hole Blocking Layer (HBL), $Cs_2CO_3$ (Concentration: 0.5 wt %) was dissolved in 2-methoxyethanol to spin-coat in the thickness of about 10 nm, and as an emitting layer, a green emitting polymer (For example poly(9,9'-dioctylfluorene-co-benzothiadiazole, F8BT) was spin-coated in the thickness of about 400 nm to use as an emitting layer. As Hole Transport Layer (HTL), $MoO_3$ was heat-deposited in the thickness of about 10 nm, and then Au metal electron was again heat-deposited in the thickness of about 65 nm to prepare the light emitting diode as disclosed in FIG. 2.

Figure 3:
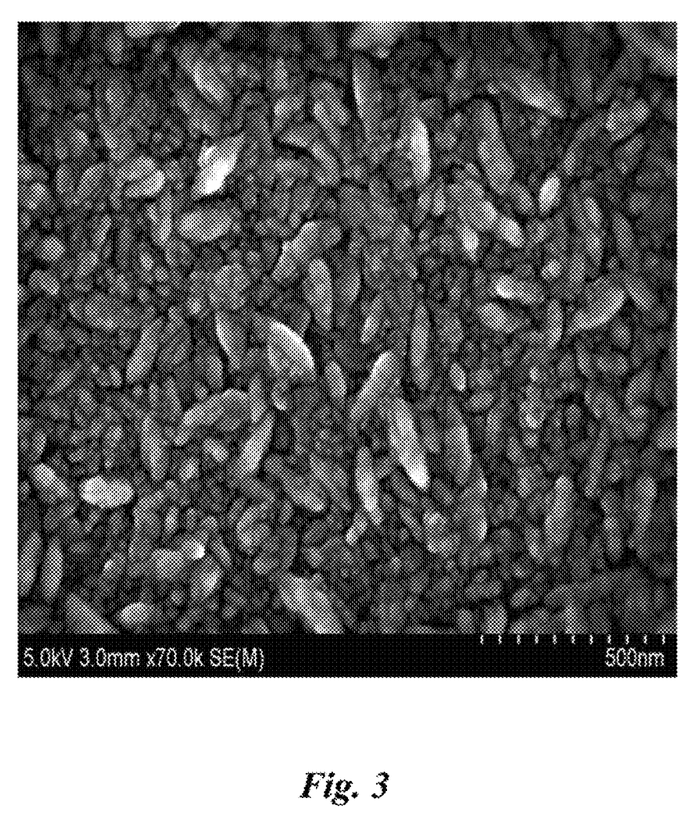
FIG. 3 is SEM image of ZnO+ doped carbon nanotube composite film prepared according to the embodiments of the present disclosure using a spray applying process.

FIG. 3 is SEM image of ZnO+ doped carbon nanotube composite film prepared according to the embodiments of the present disclosure using a spray applying process.

With reference to FIG. 3, it could be known that the doped carbon nanotube was widely distributed on ZnO substrate, but not condensated.

The boron- or nitrogen-doped carbon nanotube is electrical in local positive or negative charge at the doped point to generate an electrical resistance with neighboring boron-doped carbon nanotube or nitrogen-doped carbon nanotube. Moreover, the local polarity induced by the boron-carbon bonding or nitrogen-carbon bonding can improve solubility and wettability of the boron-doped carbon nanotube or nitrogen-doped carbon nanotube in zinc acetate dihydrate/methanol solution.

Comparative Example 1

A light emitting diode device was prepared using carbon nanotube dispersed ZnO solution with the same method as Example 1, except that a non-doped carbon nanotube was used.

Experiment Example 1

Light Emitting Property Analysis

Figure 4:
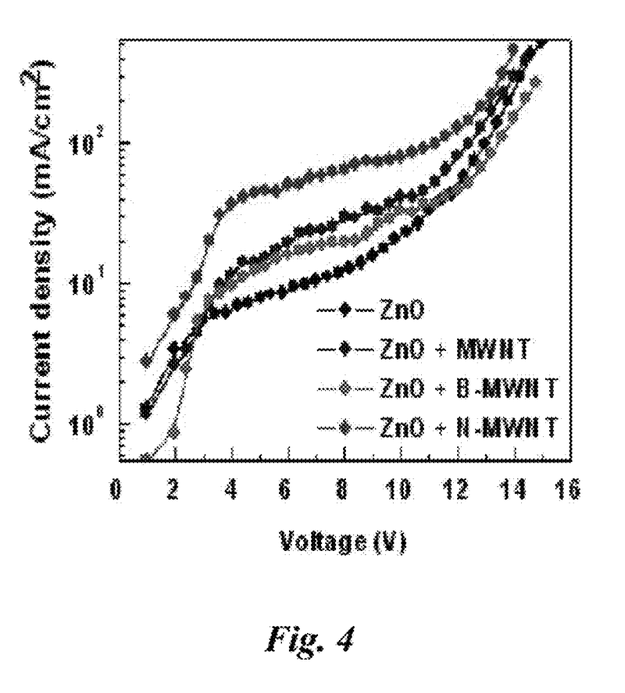
FIGS. 4 and 6 are graphs showing the analysis result about OLED light emitting property.
Figure 6:
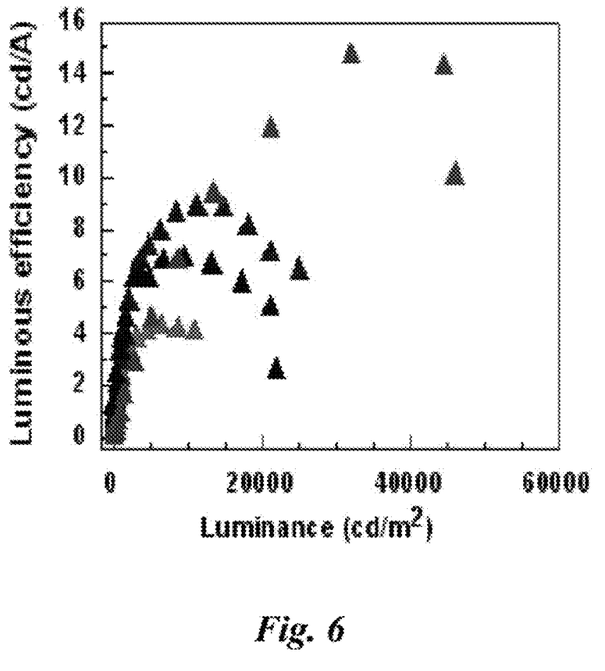

FIGS. 4 and 6 are graphs showing the analysis result about OLED light emitting property.

FIG. 4 shows current density (J)-voltage (V) property of 0.08% non-doped or doped carbon nanotube, or OLED device without carbon nanotube. As compared with OLED device without the carbon nanotube, the current density (J) of OLED device including the non-doped or doped carbon nanotube was shown to be relatively high within the range of a driving voltage (V) so that it means that the carbon nanotube greatly influenced the injections of electrons and holes in the device.

Figure 5:
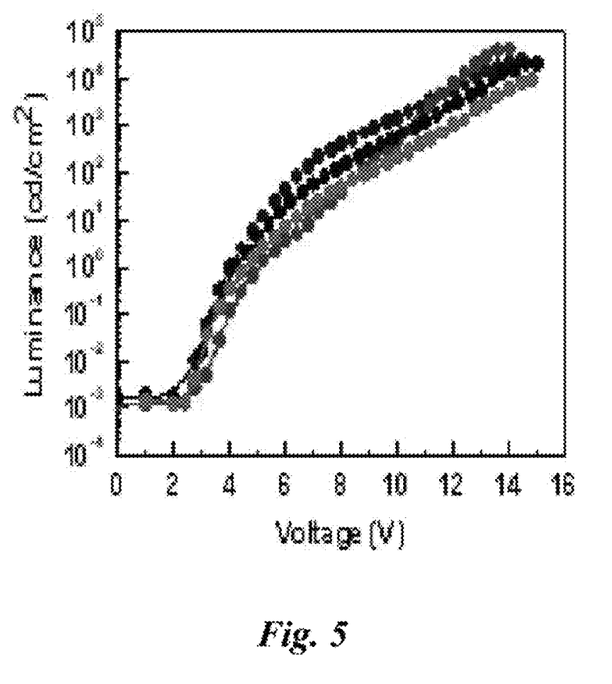

FIG. 5 shows luminous (L)-voltage (V) property of 0.08% non-doped or doped carbon nanotube, or OLED device without the carbon nanotube, and FIG. 6 shows luminous efficiency (LE)-luminance (L) property. The luminance turn-on voltage range of the device appears the similar voltage behavior without regard to as to whether the carbon nanotube is presented, and it means that the mobility of electrons injected according to the energy level matching between ZnO and non-doped or doped carbon nanotube was changed, rather than the carbon nanotube changed the energy barrier between the factor layers in the device.

Experiment Example 2

Property Analysis of Electron Transport Layer

Figure 7:
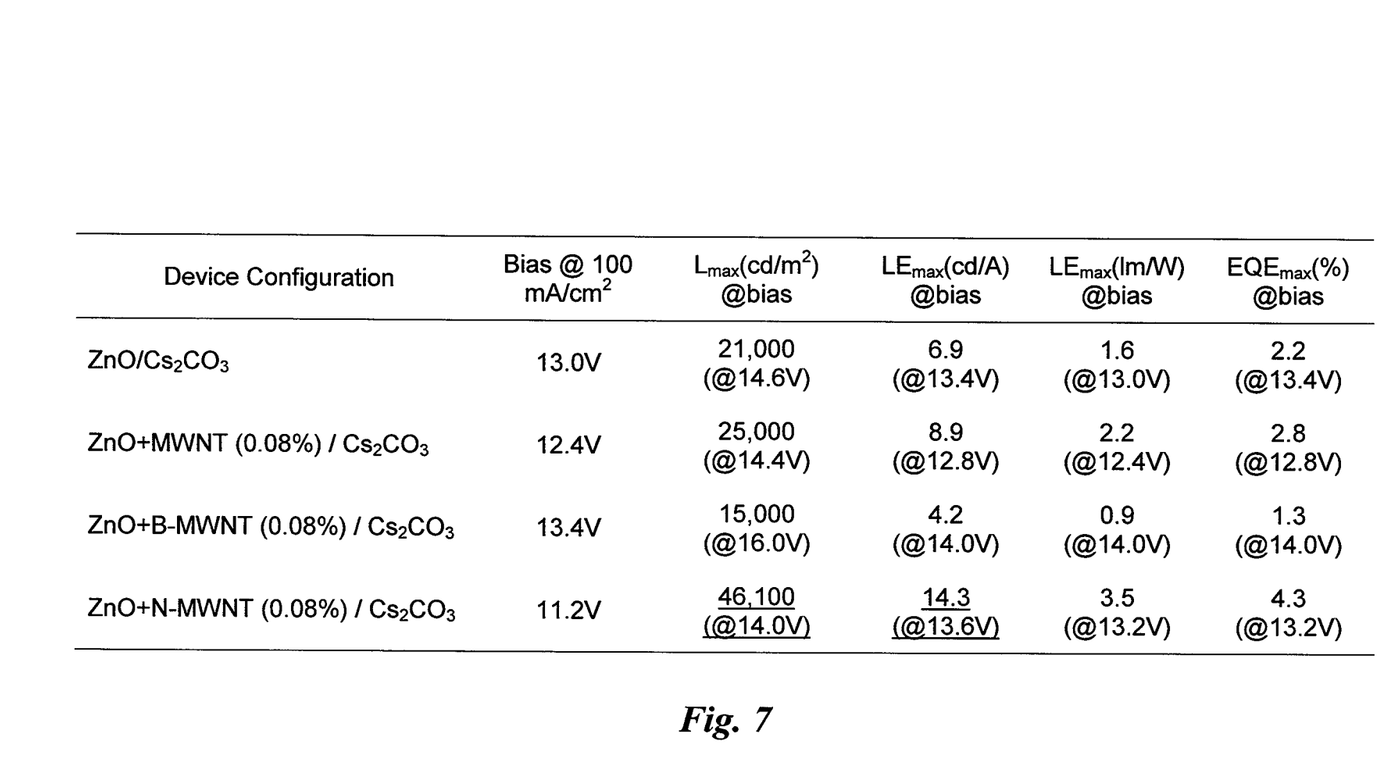
FIG. 7 is a table showing the analysis result according to a type of carbon nanotube used for an electron transport layer.

FIG. 7 is a table showing the analysis result according to a type of carbon nanotube used to an electron transport layer.

With reference to FIG. 7, it could be known that the property of light emitting was significantly increased when using N-type impurities-doped carbon nanotube (ZnO/NMWNT (0.08%)). From the result, it was verified that N-doped carbon nanotube can improve the electron mobility and can inhibit the transport of holes.

Figure 8:
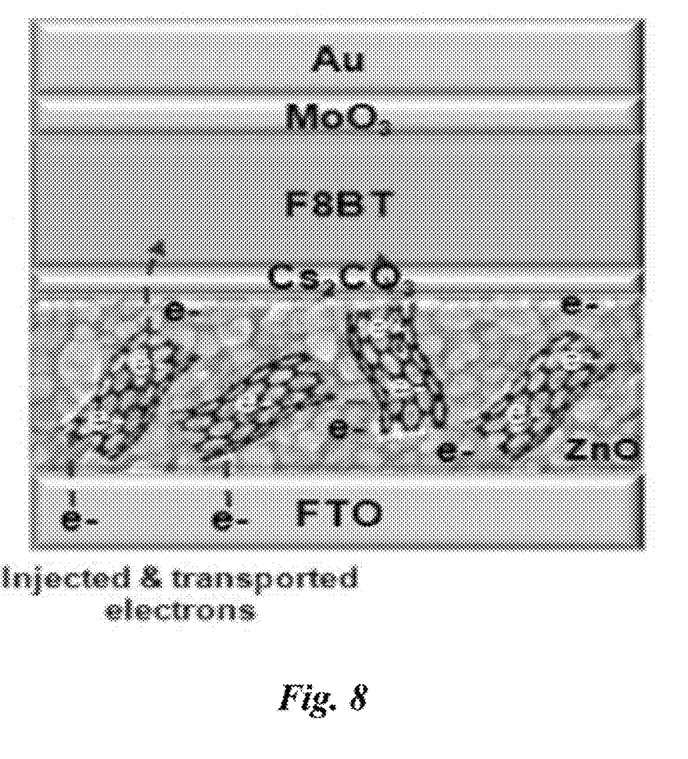
FIG. 8 is a mimetic diagram illustrating an electron transport mechanism of doped carbon nanotube according to the embodiments of the present disclosure.

FIG. 8 is a mimetic diagram illustrating an electron transport mechanism of doped carbon nanotube according to the embodiments of the present disclosure.

The present experiment can expect the improvement of the electron transport property by binding the carrier type-selective doped carbon nanotube to ZnO substrate. For example, since the work function (4.4 eV) of the nitrogen-doped carbon nanotube was close to ZnO conduction band (4.0~4.4 eV), it can easily receive the electrons injected from FTO anode to ZnO layer, and also effectively transport the electrons through the length direction of the carbon nanotube to transport the electrons in the emitting layer via the route of ZnO→Nitrogen-doped carbon nanotube→ZnO. However, when including the boron-doped carbon nanotube, the electron transport property was not improved because the work function (5.2 eV) of the boron-doped carbon nanotube was relatively high. The reason was that the electrons injected to ZnO was easily transported to the boron-doped carbon nanotube, but ~1 eV of energy barrier should be overcome in order to transport the electrons from the boron-doped carbon nanotube to ZnO, again.

Experiment Example 3

Voltage-Current Density and Electron Mobility Analysis

Figure 9:
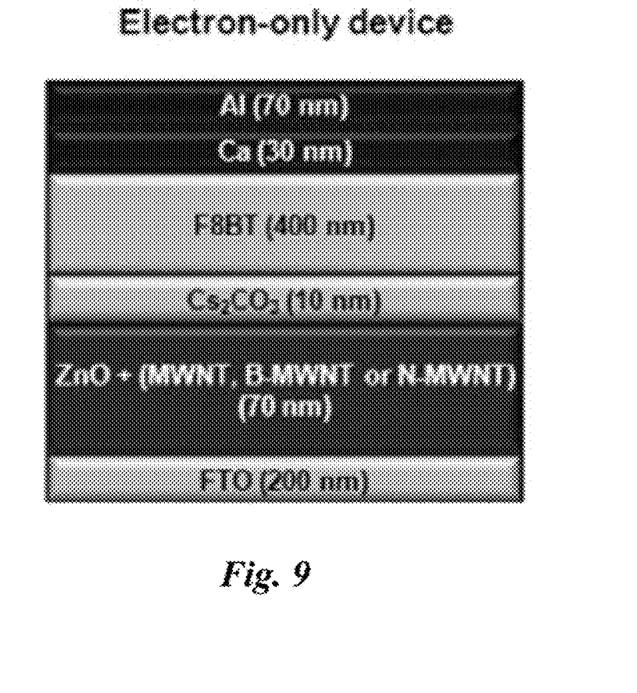
FIG. 9 is a schematic diagram of electron-only device.

For Experiment Example, the electron-only device was prepared as FIG. 9, and then the transport speed of the electrons injected in the device was analyzed when adding the non-doped or doped carbon nanotube.

Figure 10:
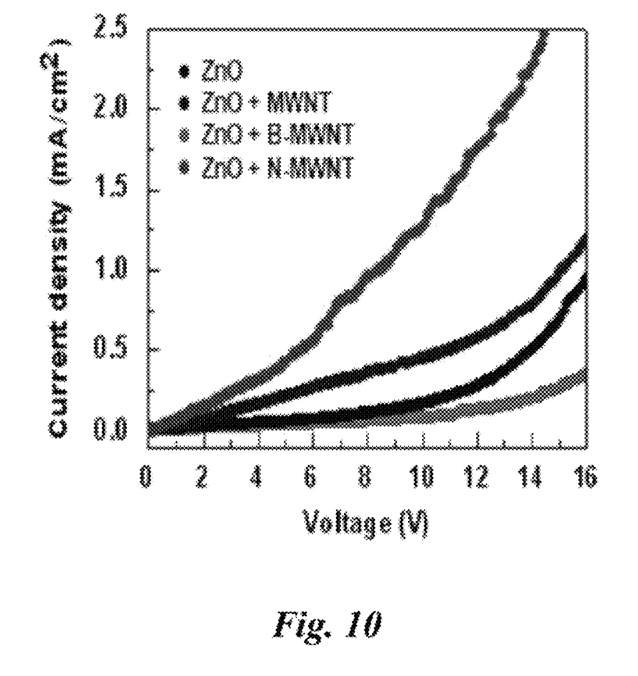
FIGS. 10 and 11 are graphs showing the results for measuring current density to an applied voltage.
Figure 11:
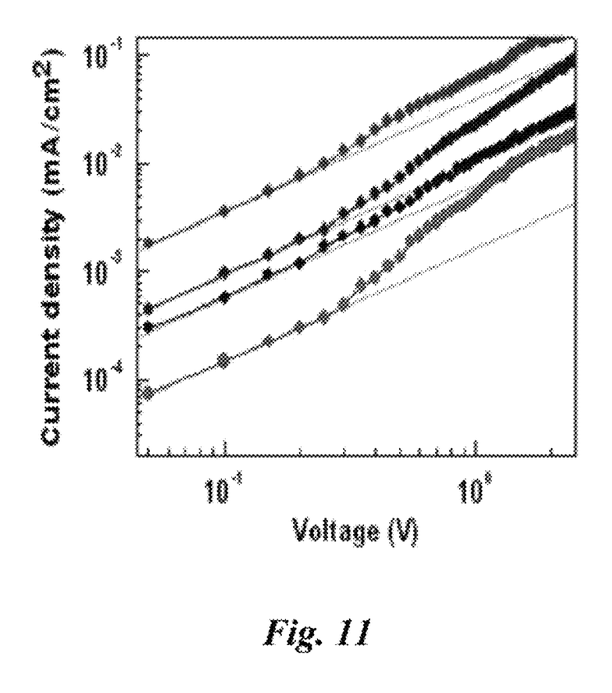

FIGS. 10 and 11 are graphs showing the results for measuring current density to an applied voltage.

With reference to FIGS. 10 and 11, it could be known that the very high current density was obtained when the N-type doped carbon nanotube was added to the electron transport layer. Especially, it could be also known that the difference of the current density was significantly increased at the voltage of at least about 5 V as compared with the non-doped carbon nanotube.

In addition, the electron mobility of each device could be quantitatively obtained from the following Mott-Gurney Formula.

Here, $\epsilon_r$ is a relative permittivity constant, $\epsilon_o$ is a permittivity of the free space, $\mu$ is an electron carrier mobility, and L is the thickness of the device. The relative permittivity constant of green light emitting polymer F8BT was fixed at about 2.9 and the thickness of the device was fixed at about 400 nm, and then the measured electron mobility was as FIG. 12.

Figure 12:
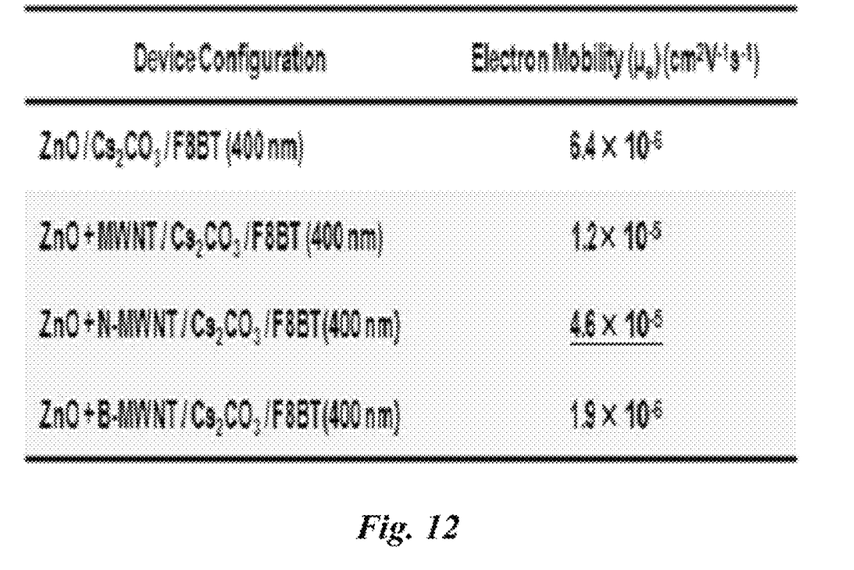
FIG. 12 is the analysis result table according to a type of carbon nanotubes used for an electron transport layer.

With reference to FIG. 12, it could be known that the electron mobility was significantly increased when the N-type impurities-doped carbon nanotube (ZnO+NMWNT) was added to ZnO layer.

Experiment Example 4

For Experiment Example for analyzing the property according to the use of only carbon nanotube layer, the light emitting device was prepared by layering a separate carbon nanotube layer on ZnO layer without the doped carbon nanotube on ZnO layer that is an electron transport layer.

Figure 13:
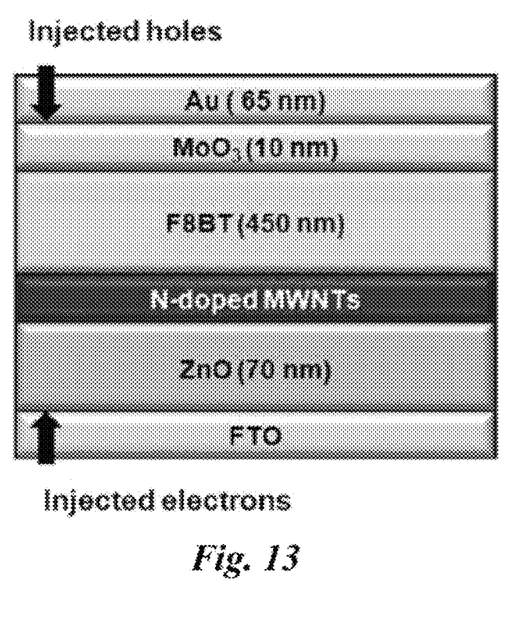
FIG. 13 is a cross-sectional diagram of the light emitting device prepared according to the embodiments of the present disclosure.

For Experiment Example, $Cs_2CO_3$ layer was replaced with N-doped carbon nanotube layer, in which the $Cs_2CO_3$ layer was mainly used as the holes blocking and/or electron transport layer in the conventional many studies. For Experiment Example, N-type doped carbon nanotube was distributed on 2-methoxyethanol, and then applied on ZnO layer to form the carbon nanotube layer on ZnO layer in a spin-coating process. FIG. 13 is a cross-sectional diagram of light emitting device prepared according to the present Experiment Example.

Figure 14:
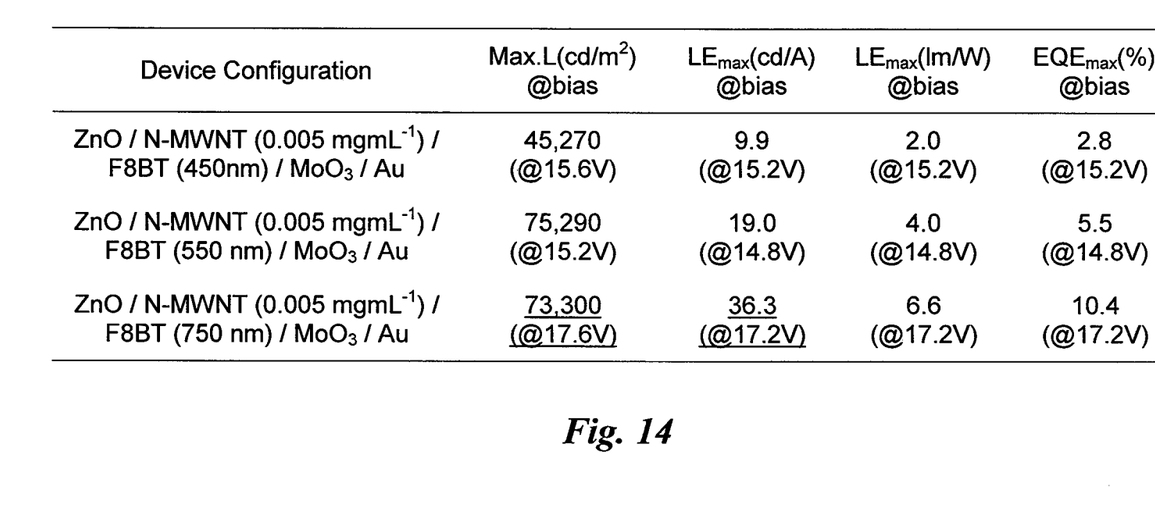
FIG. 14 is the analysis result table when using the doped carbon nanotube layer as a separate layer.

FIG. 14 is the analysis result table when using the doped carbon nanotube layer as a separate layer.

With reference to FIG. 14, it could be known that the emitting property was significantly improved when the N-type impurities doped carbon nanotube was used on ZnO layer as a separate layer.

Especially, as compared with the result of FIG. 7, it could be known that the emitting property was significantly improved when using the doped carbon nanotube as a separate layer rather than the case of using it by blending it on ZnO layer. It means that the undesired charge was blocked when using the doped carbon-nanostructure according to the present disclosure as an independent layer. As mentioned above, the present disclosure can selectively control the mobility and transport speed of electrons or holes using the N-type or P-type doped carbon structure. Therefore, the present disclosure can be applied to the device, such as a solar cell and a light emitting diode, in which the solar cell and the light emitting diode selectively transport the carrier, such as electrons, and the like. Moreover, the doped carbon nanotube according to the present disclosure can be used all the devices, such as a thin film transistor, that generates an electron flow, and it belongs to the range of the present disclosure.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for controlling a device including an electron transport layer, a hole transport layer, an active layer disposed between the electron transport layer and the hole transport layer,
the method comprising selectively controlling mobility of electrons or holes by using a nitrogen-doped or a boron-doped carbon-nanostructure.

2. The method of claim 1, wherein the carbon-nanostructure includes a graphite structure.

3. The method of claim 2, wherein the carbon-nanostructure is selected from the group consisting of graphene, carbon nanotube, carbon nanowire, graphite, fullerene, graphene quantum dot, and graphene nanoribbon.

4. The method of claim 3, wherein the P-type doped carbon-nanostructure increases the mobility of holes and decreases the mobility of electrons in the hole transporting layer.

5. The method of claim 3, wherein the N-type doped carbon-nanostructure increases the mobility of electrons and decreases the mobility of holes in the electron transporting layer.

6. The method of claim 3, wherein the carbon-nanostructure is carbon nanotube.

7. The method of claim 6, wherein the carbon nanotube is multi-wall carbon nanotube.

8. The method of any one of claims 1 to 7, wherein the device is a light emitting device.

9. The method of any one of claims 1 to 7, wherein the device is a solar cell or a thin film transistor.

10. A light emitting device comprising:
an electron transport layer;
a hole transport layer;
an active layer disposed between the electron transport layer and the hole transport layer; and
a nitrogen-doped carbon nanotube layer disposed between the electron transport layer and the active layer.

11. The light emitting device of claim 10, wherein the nitrogen-doped carbon nanotube increases movement of electrons to the active layer and decreases movement of holes at the same time.

12. A light emitting device comprising:
an electron transport layer;
a hole transport layer;
an active layer disposed between the electron transport layer and the hole transport layer; and
a boron-doped carbon nanotube layer disposed between the hole transport layer and the active layer.

13. The light emitting device of claim 12, wherein the boron-doped carbon nanotube increases movement of holes to the active layer and decreases mobility of electrons at the same time.

* * * * *